(12) United States Patent
Tezuka

(10) Patent No.: US 7,724,376 B2
(45) Date of Patent: May 25, 2010

(54) WAVEFRONT-ABERRATION MEASURING METHOD AND DEVICE, AND EXPOSURE APPARATUS INCLUDING THE DEVICE

(75) Inventor: Taro Tezuka, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 0 days.

(21) Appl. No.: 11/760,965

(22) Filed: Jun. 11, 2007

(65) Prior Publication Data

US 2007/0285671 A1    Dec. 13, 2007

(30) Foreign Application Priority Data

Jun. 13, 2006    (JP) .............................. 2006-163188

(51) Int. Cl.
G01B 11/02    (2006.01)
(52) U.S. Cl. ..................................... 356/515
(58) Field of Classification Search ................ 356/515, 356/521
See application file for complete search history.

(56) References Cited

U.S. PATENT DOCUMENTS

| | | | |
|---|---|---|---|
| 6,312,373 | B1 | 11/2001 | Ichihara |
| 6,614,535 | B1 | 9/2003 | Kakuchi et al. |
| 2004/0174533 | A1* | 9/2004 | Nakauchi ..................... 356/515 |
| 2006/0044569 | A1* | 3/2006 | Kato ........................... 356/515 |
| 2006/0061757 | A1* | 3/2006 | Yamamoto et al. ........... 356/124 |
| 2006/0262323 | A1* | 11/2006 | Yamamoto ................... 356/515 |

FOREIGN PATENT DOCUMENTS

| | | |
|---|---|---|
| JP | 2000-097666 | 4/2000 |
| JP | 2000-277412 | 10/2000 |
| JP | 2004-273748 | 9/2004 |

OTHER PUBLICATIONS

U.S. Appl. No. 11/563,453, filed Nov. 27, 2006, Tezuka.
U.S. Appl. No. 11/563,498, filed Nov. 27, 2006, Tezuka.

* cited by examiner

Primary Examiner—Tarifur Chowdhury
Assistant Examiner—Jonathon D Cook
(74) Attorney, Agent, or Firm—Rossi, Kimms & McDowell LLP

(57) ABSTRACT

The disclosure describes obtaining a first reference wavefront generated from a object plane mask slit, obtaining a second reference wavefront generated from a first image plane mask slit, measuring a wavefront of a target optical system including a reference wavefront error, and subtracting the first and the second reference wavefronts from the target optical system include the reference wavefront error.

4 Claims, 13 Drawing Sheets

Prior Art

Prior Art

Prior Art

WAVEFRONT-ABERRATION MEASURING METHOD AND DEVICE, AND EXPOSURE APPARATUS INCLUDING THE DEVICE

BACKGROUND OF THE INVENTION

1. Field of the Invention

The present invention relates to a measurement method and apparatus.

2. Description of the Related Art

A projection exposure apparatus has conventionally been used to manufacture a fine semiconductor device, such as a semiconductor memory and a logic circuit, using the photolithography technology. The projection exposure apparatus uses a projection optical system to project and transfer a pattern of a reticle onto a wafer.

The projection exposure apparatus is required to precisely transfer a reticle pattern onto a wafer at a preset magnification or reduction ratio, and use of a projection optical system having an extremely reduced aberration (or an excellent imaging characteristic). In particular, along with the recent rapid miniaturization of a semiconductor device, a transferred pattern is sensitive to an aberration of an optical system. There is a demand for a precise measurement of an optical characteristic of the projection optical system, such as a wavefront aberration, while the projection optical system is installed in the exposure apparatus. In order to improve the productivity and the economical efficiency, easy, rapid, and inexpensive measurements are important.

An interferometer, such as a Fizeau interferometer and a Twyman-Green interferometer, is known as one conventional measurement apparatus that measures a wavefront aberration of an optical system, and an exposure apparatus mounted with the interferometer is proposed. See Japanese Patent Laid-Open No. 2000-277412. However, the conventional interferometer, such as a Fizeau interferometer and a Twyman-Green interferometer, complicates a structure of the entire system, has a problem of a large size and an increased cost, and it is very difficult to actually install it in the exposure apparatus. Accordingly, it is proposed to install in an exposure apparatus a comparatively simply structured interferometer, such as a point diffraction interferometer ("PDI") (Japanese Patent Laid-Open No. 2000-97666) and a linear diffraction interferometer ("LDI") (Japanese Patent Laid-Open No. 2004-273748).

Nevertheless, the conventional interferometer or measurement apparatus cannot precisely measure a wavefront aberration of a projection optical system. For example, the LDI finds a primary wavefronts of the projection optical system in two measurement directions which has a correct relative relationship in a direction perpendicular to the slit's longitudinal direction, and measures a final wavefront (wavefront aberration of the projection optical system) using phase information of the mutual measurement directions. The reference wavefront used to calculate the primary wavefront utilizes a slit diffraction wavefront that is a wavefront generated by a fine aperture slit equal to or smaller than the diffraction limit. When the slit diffraction wavefront is not an ideal reference wavefront (or when a reference wavefront contains an error), a difference from the ideal reference wavefront causes a measured optical system to contain a wavefront error and an error factor in the wavefront measurement by the LDI.

BRIEF SUMMARY OF THE INVENTION

The present invention is directed to a measurement method and apparatus that can precisely measure an optical characteristic, such as a wavefront aberration, of an optical system.

A measurement method according to one aspect of the present invention measures a wavefront aberration of a target optical system using an object plane mask and an image plane mask. The object plane mask is arranged on an object plane side of the target optical system and includes a first object plane mask slit and a second object plane mask slit. The image plane mask is arranged on an image plane side of the target optical system and includes a first image plane mask slit and a second image plane mask slit. The first object plane mask slit has a width in a shorter direction, which is equal to or smaller than a diffraction limit of the target optical system. The second object plane mask slit has a width in a shorter direction, which is close to or greater than the width of the first object plane mask slit. The first image plane mask slit has a width in a shorter direction that is equal to or smaller than the diffraction limit of the target optical system. The second object plane mask slit has a width in a shorter direction that is greater than the diffraction limit of the target optical system. The measurement method includes the steps of measuring a first reference wavefront generated from the first object plane mask slit by interference between light from a slit having the same shape as the first object plane mask slit and light from an object plane mask pinhole, measuring a second reference wavefront generated from the first image plane mask slit by interference between light from a slit having the same shape as the first image plane mask slit and light from an image plane mask pinhole, measuring a wavefront of the target optical system including a reference wavefront error from an interference pattern formed by interference between light from the first image plane mask slit and light from the second image plane mask slit, and subtracting the first and the second reference wavefronts from the target optical system include the reference wavefront error.

Further features of the present invention will become apparent from the following description of exemplary embodiments with reference to the attached drawings.

BRIEF DESCRIPTION OF THE DRAWINGS

FIG. 5A is a schematic sectional view of an entire structure of the PDI, and FIG. 5B is a schematic plane view of a pattern of the PDI.

FIG. 6A is a schematic sectional view of the entire exposure apparatus, and FIG. 6B is a schematic plane view of the object plane side measurement pattern and the image side measurement pattern.

FIGS. 11A, 11B, and 11C are a first primary wavefront, a second primary wavefront, and a wavefront of the target optical system.

DESCRIPTION OF THE EMBODIMENTS

Figure 1:
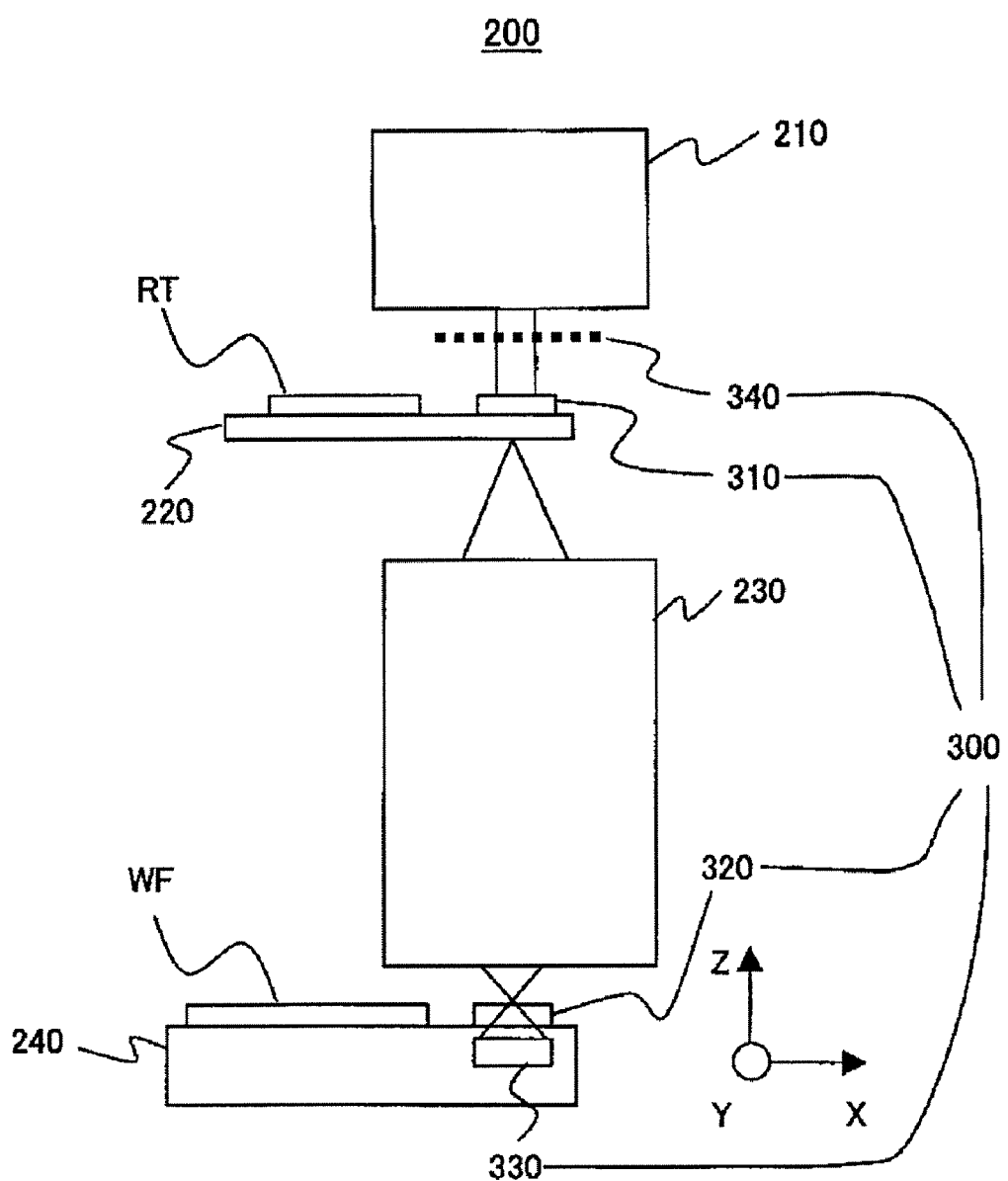
FIG. 1 is a schematic sectional view of a structure of an exposure apparatus according to one aspect of the present invention.

Referring now to the accompanying drawings, a description will be given of a preferred embodiment of the present invention. The same or corresponding elements in each figure are designated by the same reference numerals, and a duplicate description thereof will be omitted.

Figure 8:
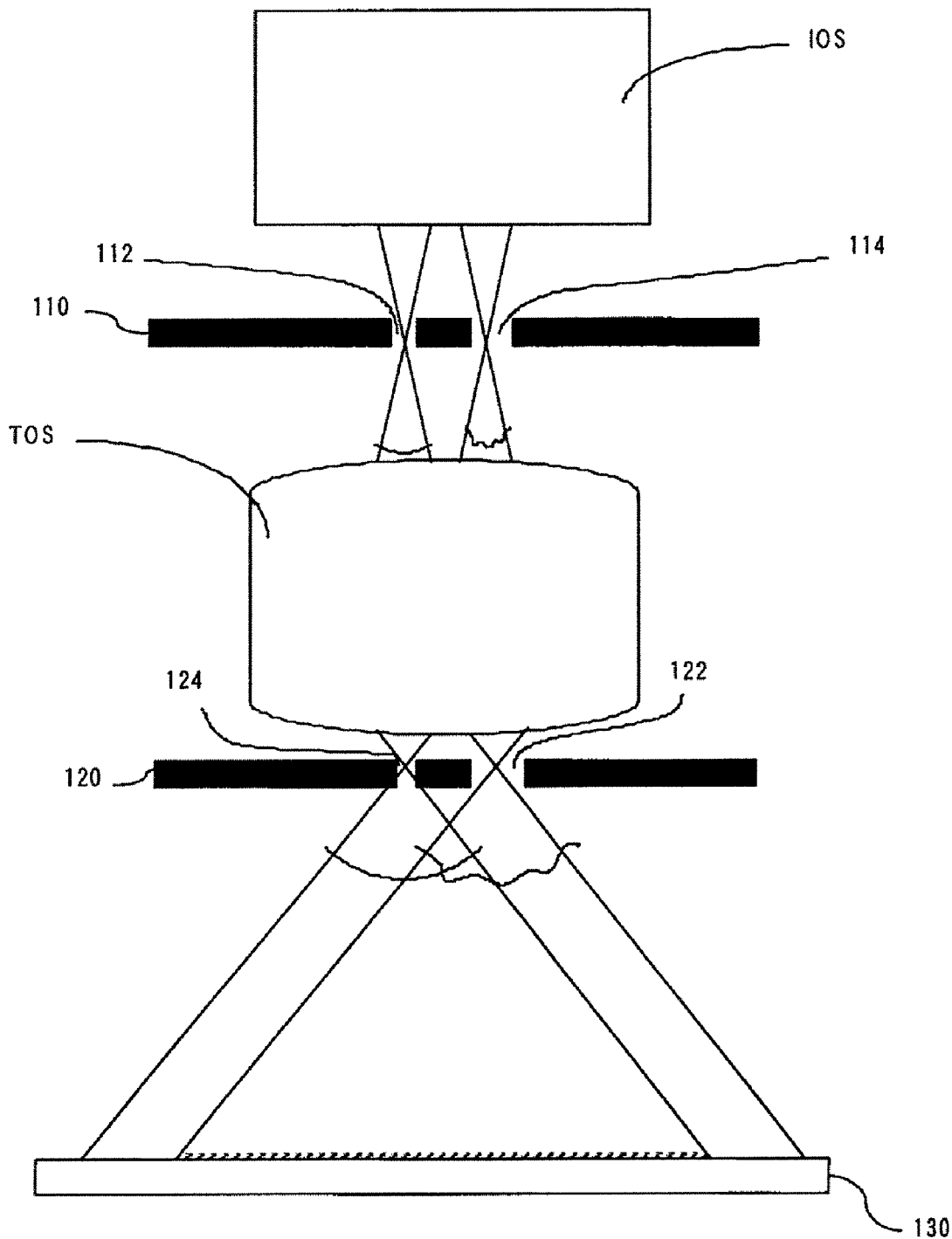
FIG. 8 is a view for explaining a principle of a wavefront measurement by the LDI.

Referring now to FIG. 8, a description will be given of a principle of a wavefront measurement using the LDI. The wavefront measurement using the LDI uses an object plane side measurement mask 110 that has a pair of parallel slits 112 and 114 closely arranged at the object plane side of a target optical system TOS.

Figures 9A, 9B:
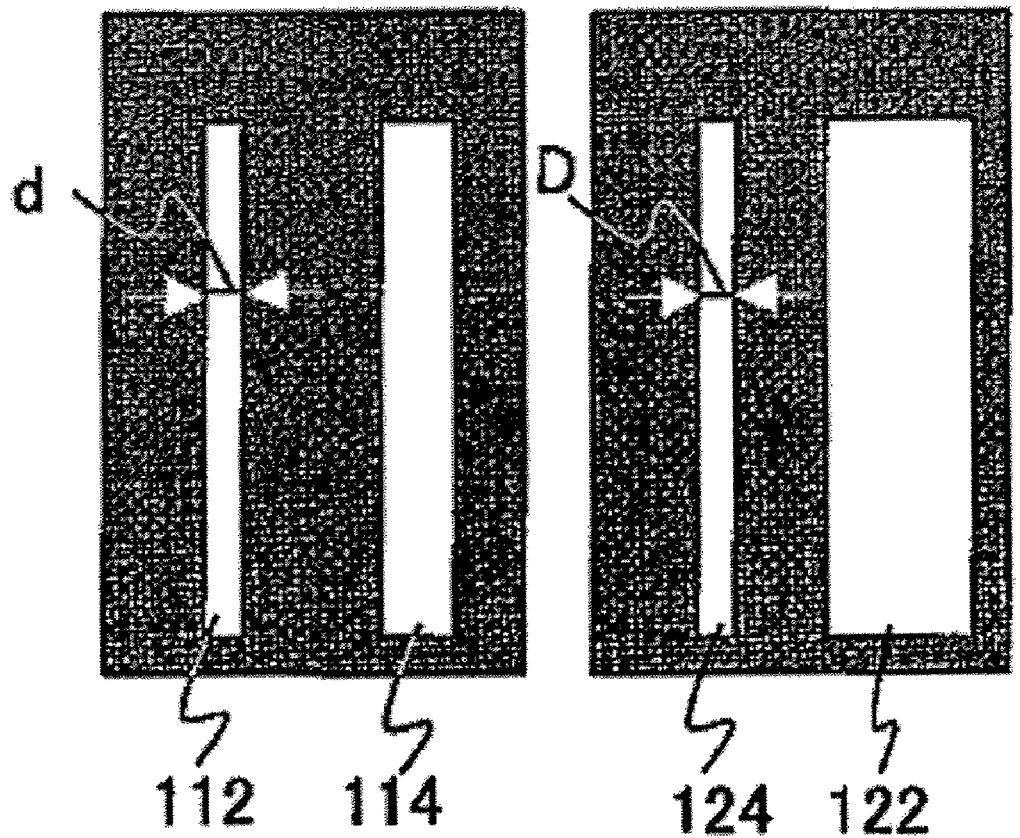
FIG. 9A is a schematic plane view of the object plane side measurement mask shown in FIG. 8.
FIG. 9B is a schematic plane view of the image plane side measurement mask shown in FIG. 8.

This embodiment sets a (slit) width in a shorter direction of at least one slit in the object plane side measurement mask 110, which is the slit (slit-shaped illumination area) 112, to be equal to or smaller than a diffraction limit or resolving power of the target optical system TOS at its object plane side. A slit width d of the slit 112 preferably satisfies $d \leq 0.5 \times \lambda/na$ as shown in FIG. 9A, where na is a numerical aperture of the target optical system TOS at its object plane side, and $\lambda$ is a wavelength. Here, FIG. 9A is a schematic plane view of the object plane side measurement mask 110.

The slit 114 may be a slit that has the same slit width as the slit 112, or a slit that has a slit width wider than the slit 112. The widths of the slits 112 and 114 in their longer directions are maintained set narrower than a so-called isoplanatic region so that an aberration of the target optical system TOS can be regarded as the same. The slits 112 and 114 are closely arranged so that the interval between them is narrower than the isoplanatic region.

When the object plane side measurement mask 110 or the slits 112 and 114 are illuminated using the light from an illumination optical system IOS, the light emitted from the slit 112 has an aplanatic aberration with respect to the shorter direction of the slit 112. The light emitted from the slit 114 has a wavelength that contains influence of the aberration of the illumination optical system IOS when the slit width of the slit 114 is greater than that of the slit 112.

The rays emitted from the slits 112 and 114 pass the target optical system TOS, and their wavefronts are subject to the aberration of the target optical system TOS, forming images of the slits 112 and 114 on the image plane of the target optical system TOS.

The image plane side measurement mask 120 is arranged at the image side of the target optical system TOS. More specifically, a slit 122 is arranged at an image position of the slit 112, and a slit 124 is arranged at an image position of the slit 114.

A slit width in a shorter direction of the slit 124 is set to be equal to or smaller than a diffraction limit of the target optical system TOS at its object plane side. A slit width D of the slit 124 preferably satisfies $D \leq 0.5 \times \lambda/NA$ as shown in FIG. 9B, where NA is a numerical aperture of the target optical system TOS at its image plane side, and $\lambda$ is a wavelength. Here, FIG. 9B is a schematic plane view of the object plane side measurement mask 120.

The light imaged on the slit 124 is the light having a wavefront influenced by the aberration of the target optical system TOS (and the aberration of the illumination optical system ISO depending upon the slit width of the slit 114). When the light passes the slit 124, the light has an aplanatic wavefront with respect to the shorter direction of the slit 124.

The slit width in the shorter direction of the slit 122 is much larger than or preferably 10 to 100 times as large as the diffraction limit of the target optical system TOS. The light imaged on the slit 122 is the light having a wavefront that is influenced by the aberration of the target optical system TOS with respect to the shorter direction of the slit 122. Since the slit width (window) of the slit 122 is large enough, the light having a wavefront that is influenced by the aberration of the target optical system TOS is emitted as it is.

The light from the slit 122 interferes with the light from the slit 124, forming an interference pattern or fringe. When an area image sensor or area sensor 130, such as a CCD, detects the interference pattern, a wavefront of the target optical system TOS (first primary wavefront) can be obtained which has a correct relative relationship in a (measurement) direction perpendicular to the slit's longer direction.

Figure 10A:
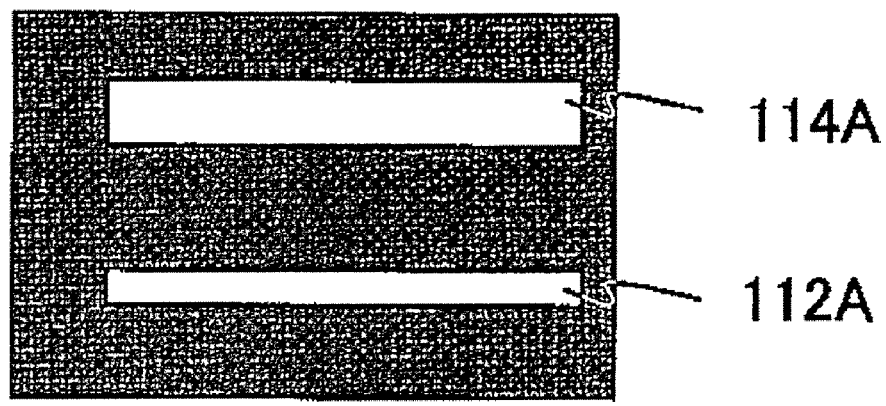
FIGS. 10A and 10B are schematic plane views of the object plane side measurement mark and the image plane side measurement mask having slits orthogonal to the slits of the object plane side measurement mask and the image plane side measurement mask shown in FIGS. 9A and 9B.
Figure 10B:
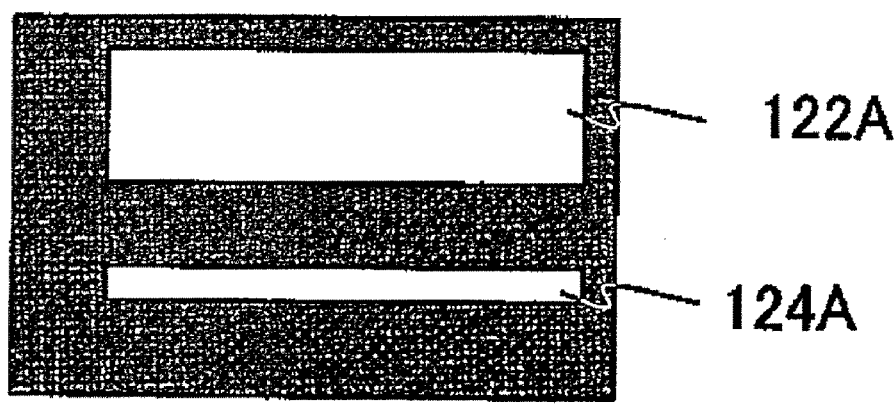

A wavefront (second primary wavefront) of the target optical system TOS which has a correct relative relationship in a direction perpendicular to the slit's longer direction can be obtained similarly with the object plane side measurement mask 110A and the image plane side measurement mask 120A shown in FIGS. 10A and 10B. The object plane side measurement mask 110A has slits 112A and 114A in a direction orthogonal to the slits 112 and 114. The image plane side measurement mask 120A has slits 122A and 124A in a direction orthogonal to the slits 122 and 124. Here, FIG. 10A is a schematic plane view of the object plane side measurement mask 110A having a slit orthogonal to the slit of the object plane side measurement mask 110. FIG. 10B is a schematic plane view of the image plane side measurement mask 120A having a slit orthogonal to the slit of the image plane side measurement mask 120.

The wavefront of the target optical system TOS can be calculated using thus obtained, two primary wavefronts, i.e., the first and second primary wavefronts, or from phase information in mutual measurement directions.

Figure 11A:
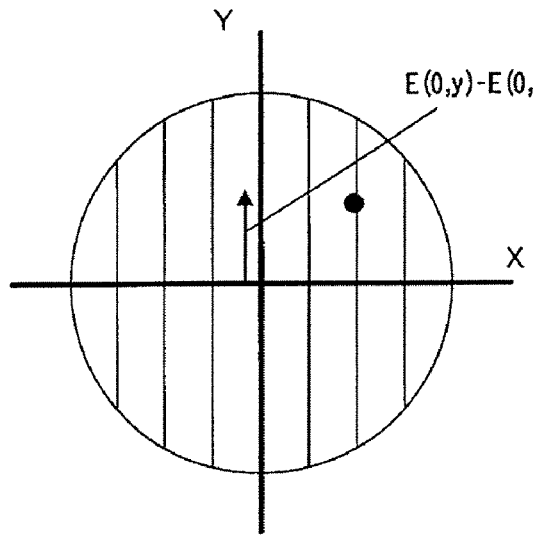
FIGS. 11A to 11C are views for explaining an obtaining method of wavefront information of a target optical system from two primary wavefronts.
Figure 11B:
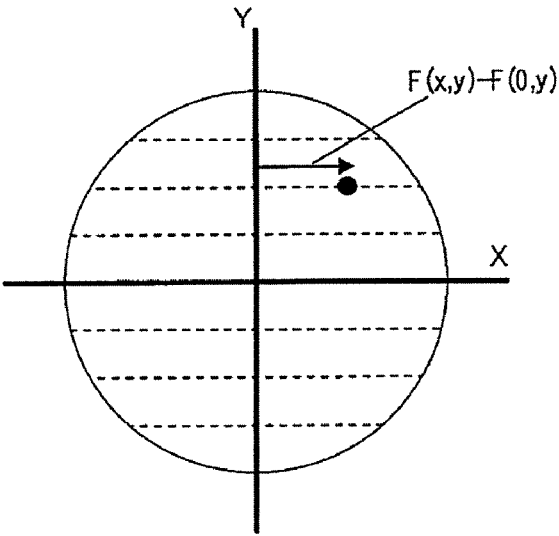
Figure 11C:
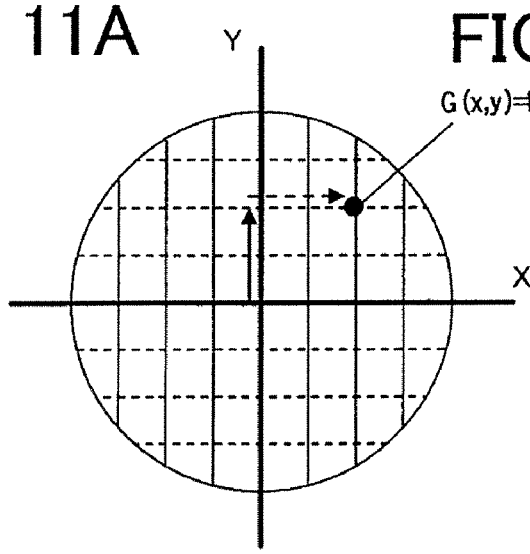

Referring now to FIGS. 11A to 11C, a description will be given of a method for obtaining the wavefront information of the target optical system from two primary wavefronts. FIGS. 11A, 11B, and 11C show the first primary wavefront, the second primary wavefront, and the wavefront of the target optical system TOS, respectively. In FIG. 11A, a relative relationship of a phase on the line parallel to the Y-axis is equal to a relative relationship of a phase on the same line in FIG. 11C. In FIG. 11B, a relative relationship of a phase on the line parallel to the X-axis is equal to a relative relationship of a phase on the same line in FIG. 11C. From these relative relationships, a phase at a point G(x, y) of a wavefront of the target optical system TOS is given by Equation 1 below with phase variance amounts E(0, y)−E(0, 0) and F(x, y)−F(0, y):

$$G(x,y)=E(0,y)-E(0,0)+F(x,y)-F(0,y) \quad \text{EQUATION 1}$$

The wavefront of the target optical system TOS shown in FIG. 11C can be thus obtained from two primary wavefronts shown in FIGS. 11A and 11B.

Nevertheless, the thus obtained wavefront of the target optical system TOS can contain a measurement error when the slit diffraction wavefront generated by the slit is not an ideal reference wavefront, as discussed above.

Hence, the measurement method and apparatus according to the present invention reduce the influence of the measurement error caused by the error of the slit diffraction wavefront that could be the reference wavefront.

A description will be given of the measurement method and apparatus according to the present invention, and an exposure apparatus that applies the measurement method and apparatus. FIG. 1 is a schematic sectional view of a structure of an exposure apparatus 100 according to one aspect of the present invention.

The exposure apparatus 200 is a projection exposure apparatus that exposes a pattern of a reticle RT onto a wafer WF. The exposure apparatus 200 of this embodiment is a step-and-scan projection exposure apparatus, but can adopt a step-and-repeat manner.

The exposure apparatus 200 includes, as shown in FIG. 1, an illumination apparatus 210, a wafer stage 220 that supports the reticle RT, a projection optical system 230, a wafer stage that supports the wafer WF, and a measurement apparatus 300.

The illumination apparatus 210 illuminates the reticle RT that has a pattern to be transferred, and includes a light source (not shown), and an illumination optical system (not shown). The illumination apparatus 210 illuminates the object plane side measurement mask 310, which will be described later.

The light source uses an ArF excimer laser having a wavelength of about 193 nm, and a KrF excimer laser having a wavelength of about 248 nm. However, the light source may use an $F_2$ laser having a wavelength of about 157 nm, and the number of lasers is not limited.

The illumination optical system is an optical system that illuminates the reticle RT and the object plane side measurement mask 310, and includes a lens, a mirror, an optical integrator, a stop, etc. The illumination optical system includes, for example, a condenser lens, an optical integrator, an aperture stop, a condenser lens, a slit, and an imaging optical system in this order.

The reticle RT is made of quartz, has a pattern to be transferred, and is supported on the reticle stage 220.

The reticle 220 supports the reticle RT and the object plane side measurement mask 310, and is connected to a moving mechanism (not shown).

The projection optical system 230 projects the pattern of the reticle RT onto the wafer WF. The projection optical system 230 may be dioptric, catadioptric, or catoptric.

This embodiment uses the wafer WF for a substrate to be exposed, but can use a glass plate or another substrate for the substrate. A photoresist is applied to the surface of the wafer WF.

The wafer stage 240 supports the wafer WF and the image plane side measurement mask 320.

The measurement apparatus 300 is an interferometer that measures a wavefront or wavefront aberration of the projection optical system 230 as a target optical system, and utilizes a measurement principle of the above LDI. The measurement apparatus 300 includes the object plane side measurement mask 310, an image plane side measurement mask 320, and an area sensor 330. The measurement apparatus 300 utilizes the exposure light emitted from the illumination apparatus 210 for the light that illuminates the object plane side measurement mask 310.

Figure 2:
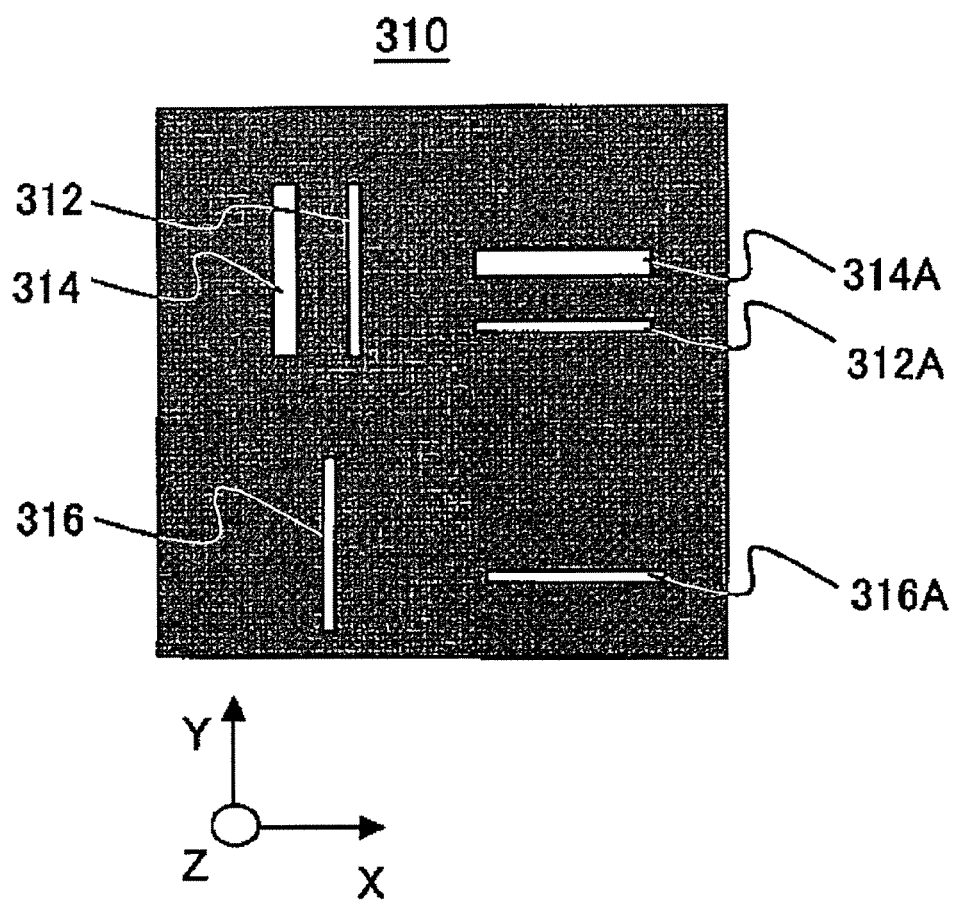
FIG. 2 is a schematic plane view showing an object plane side measurement mask arranged on a reticle stage shown in FIG. 1.
Figure 3:
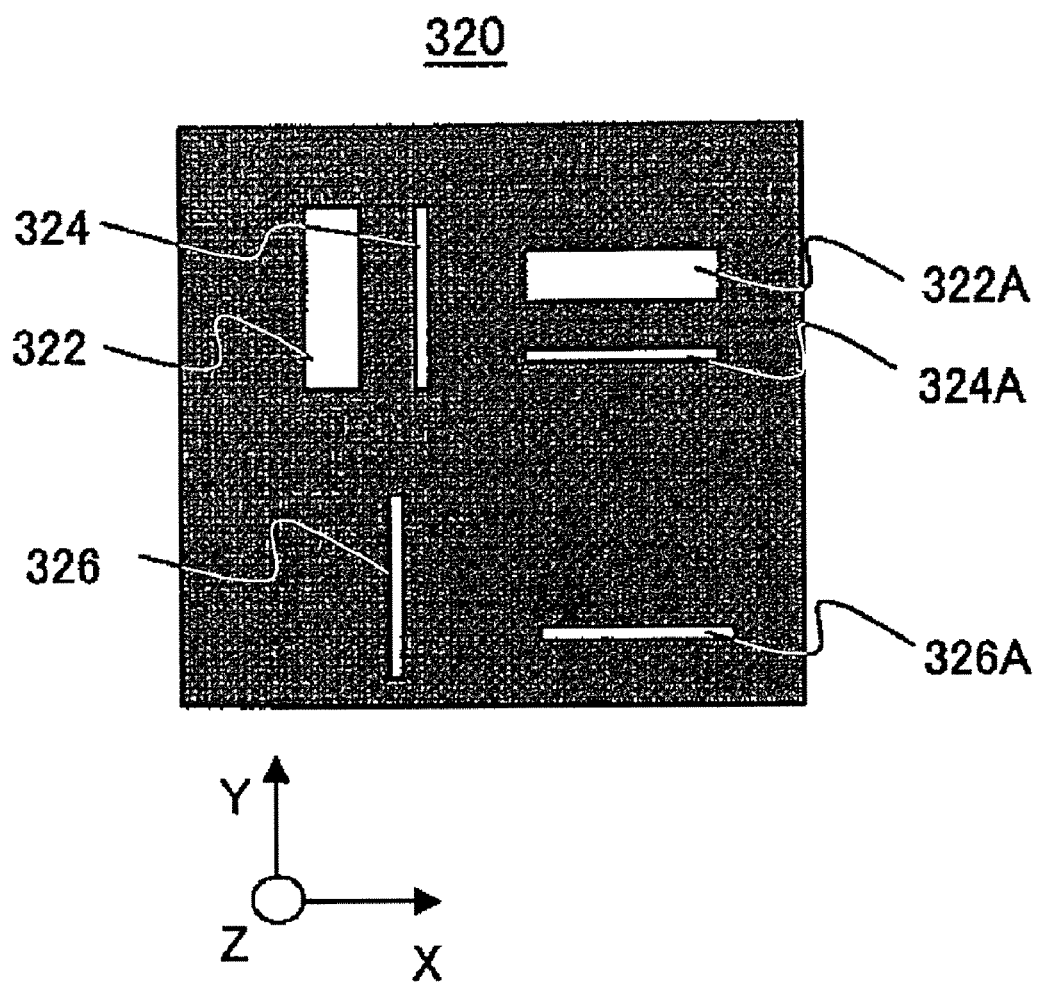
FIG. 3 is a schematic plane view showing an image plane side measurement mask arranged on a wafer stage shown in FIG. 1.

FIG. 2 is a schematic plane view of the object plane side measurement mask 310 arranged on the reticle stage 220. FIG. 3 is a schematic plane view of the object plane side measurement mask 320 arranged on the wafer stage 240. The object plane side measurement mask 310 and the image plane side measurement mask 320 are pattern groups used to measure the primary wavefront in the measurement directions of 0° and 90° relative to the X-axis on the XY plane of the coordinate system of the projection optical system 230 shown in FIGS. 1 to 3.

The object plane side measurement mark 310 has slits 312 and 314 used to measure the measurement direction of 0°, 312A and 314A used to measure the measurement direction of 90° (orthogonal to the measurement direction of 0°), and sample slits 316 and 316A. For example, the object plane side measurement mask 310 uses the slits 312 and 314 to measure the first primary wavefront of the projection optical system 230, and uses the slits 312A and 314A to measure the second primary wavefront of the projection optical system 230.

The (slit) width in the shorter direction of the slit 312 is set to about 0.5×/na, where na is a numerical aperture of the projection optical system 230 at its reticle side, and is a wavelength of the (exposure) light from the illumination apparatus 210. The slit 314 has a slit width greater than that of the slit 312. The slits 312A and 314A are formed orthogonal to the slits 312 and 314. The slits 312A and 314A have silt widths similar to the slits 312 and 314.

The sample slits 316 and 316A have the same shapes as the slits 312 and 312A, and are used to measure the diffraction wavefronts generated by the slits 312 and 312A, which will be described later.

The image plane side measurement mask 320 corresponds to the object plane side measurement mask 310, and has slits 322 and 324, and slits 322A and 324A. Moreover, the image plane measurement mask 320 has sample slits 326 and 326A. The image plane side measurement mask 320 uses, for example, the slits 322 and 324 to measure the first primary wavefront of the projection optical system 230, and the slits 322A and 324A to measure the second primary wavefront of the projection optical system 230.

The slit 322 has a (slit) width in a shorter direction greater than the diffraction limit of the projection optical system 230. The slit width of the slit 324 is set to about 0.5×/NA, where NA is a numerical aperture of the projection optical system 230 at the wafer side, and is a wavelength of the exposure light from the illumination apparatus 210. The slits 322A and 324A are formed orthogonal to the slits 322 and 324. The slits 322A and 324A have slit widths similar to the slits 322 and 324.

The sample slits 326 and 326A have the same shapes as those of the slits 324 and 324A, and are used to measure the diffraction wavefronts generated by the slits 324 and 324A, as described later.

The area sensor 330 is arranged under the image plane side measurement mask 320, and detects an interference pattern formed by two transmitting rays that have transmitted the slits 322, 324, 322A, and 324A. This embodiment uses a transmission type slit. When a reflection type slit is used, the area sensor 330 detects an interference pattern formed by two reflected rays that have reflected on the slits 322, 324, 322A, and 324A.

Figure 4:
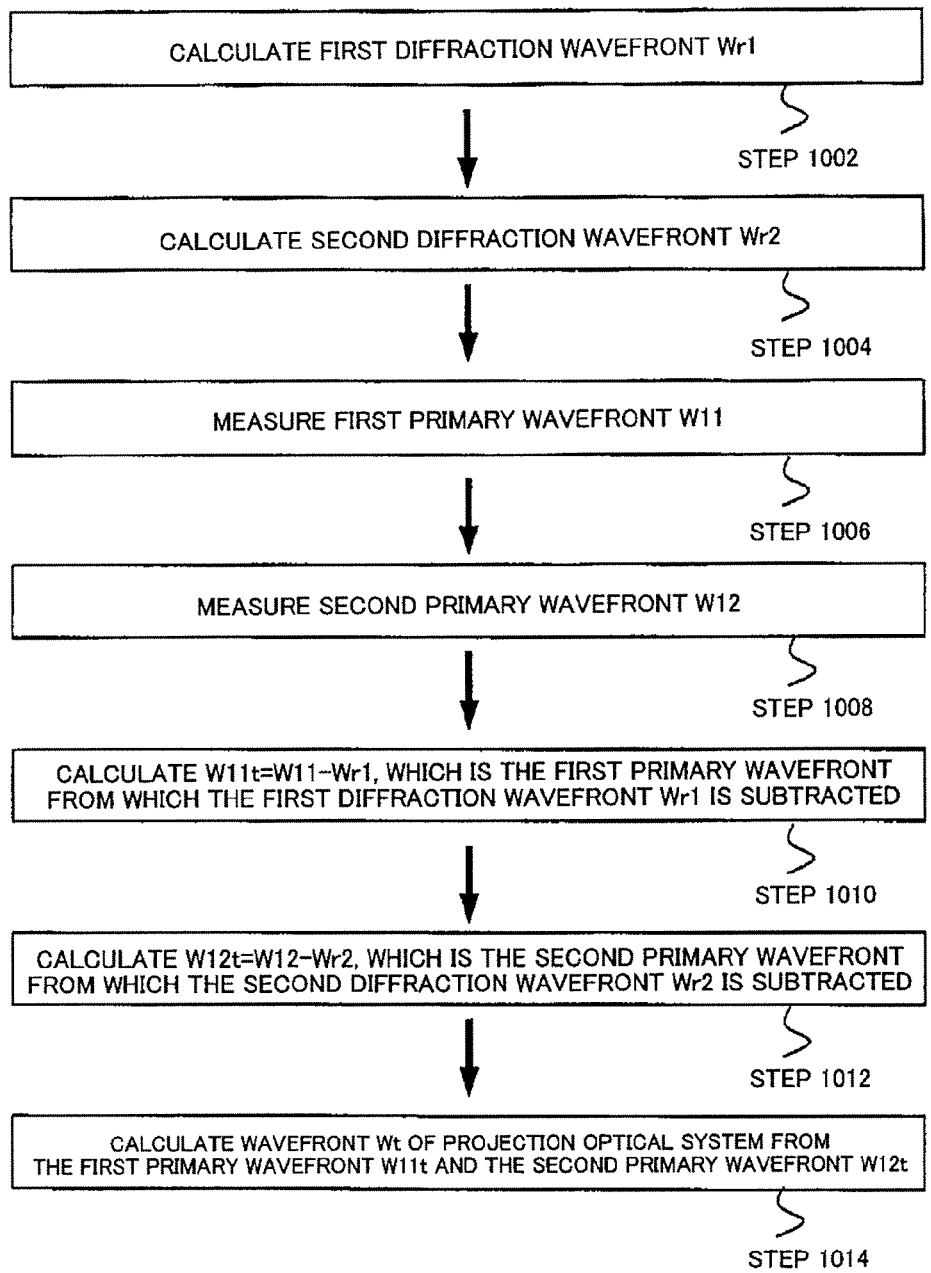
FIG. 4 is a flowchart for explaining a measurement method according to one aspect of the present invention.

Referring now to FIG. 4, a description will be given of a measurement method of a wavefront aberration of the projection optical system 230 that uses the measurement apparatus 300. FIG. 4 is a flowchart for explaining a measurement method according to one aspect of the present invention.

Initially, a diffraction wavefront (object plane side reference wavefront) Wro1 of the slit 312 of the object plane side measurement mask 310 and a diffraction wavefront (image plane side reference wavefront) Wri1 of the slit 324 of the image plane side measurement mask 320 used to measure the first primary wavefront of the projection optical system 230 used to measure the first primary wavefront of the projection optical system 230 are obtained (step 1002). The diffraction wavefronts Wro1 and Wri1 are obtained through measurements, for example, by using a wavefront measurement apparatus, such as a PDI, which is installed inside and outside the exposure apparatus 200. Assume that a first diffraction wavefront Wr1 is set to a sum (=Wro1+Wri1) between the diffraction wavefronts Wro1 and Wri1.

Figure 5A:
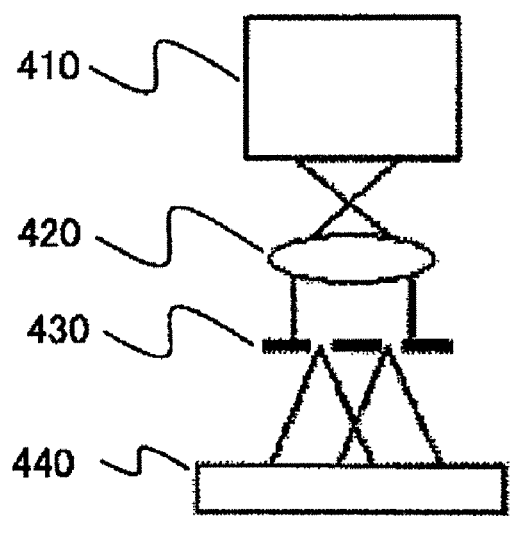
FIGS. 5A and 5B show a structure of a PDI that is configured differently from an exposure apparatus shown in FIG. 1.
Figure 5B:
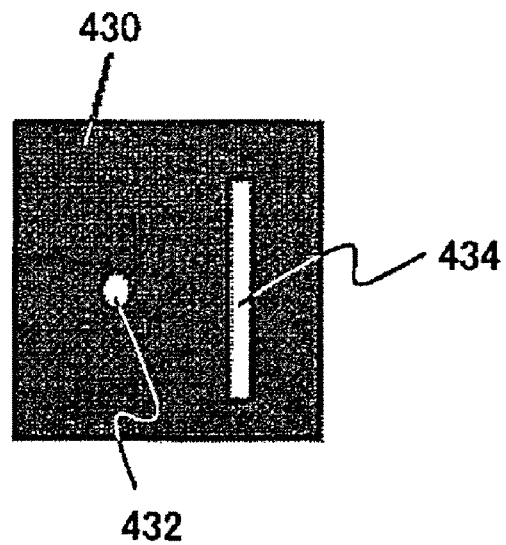

FIGS. 5A and 5B show a structure of the PDI 400 configured differently from the exposure apparatus 200. FIG. 5A is a schematic sectional view of the entire structure of the PDI 400. FIG. 5B is a schematic plane view of a pattern 430 of the PDI 400. The PDI 400 measures the diffraction wavefront Wro1 of the slit 312 and the diffraction wavefront Wri1 of the slit 324. More specifically, the light from a light source 410 having an excellent special coherence is collimated by a collimator lens 420, and irradiated onto the pattern 430 having a pinhole 432 that generates a reference wavefront and a slit 434 as a target wavefront, as shown in FIG. 5A. The slit 434 has the same shape as the slit 312 of the object plane side measurement mask 310 and the slit 324 of the image plane side measurement mask 320. Two rays emitted from the pinhole 432 and the slit 434 form an interference pattern, and an area sensor 440 takes the interference pattern, thereby measuring the diffraction wavefront Wro1 of the slit 312 and the diffraction wavefront Wri1 of the slit 324.

Figures 6A, 6B:
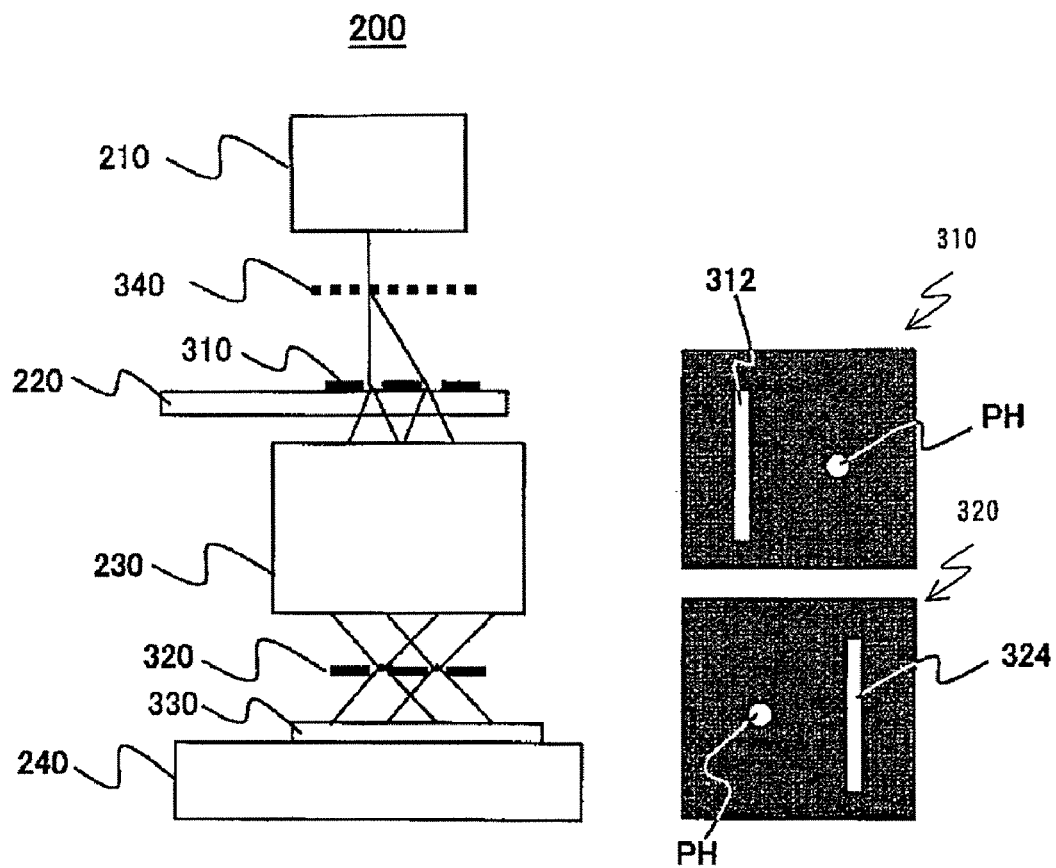
FIGS. 6A and 6B show a structure of an exposure apparatus that includes the PDI.

FIGS. 6A and 6B show the structure of the exposure apparatus 200 that includes the PDI. FIG. 6A is a schematic sectional view of the entire structure of the exposure apparatus 200. FIG. 6B is a schematic plane view of the object plane side measurement pattern 310 and the image plane side measurement pattern 320. The PDI is structurally similar to the LDI, and easily incorporated into the exposure apparatus 200. Basically, the PDI is configured by replacing the object and image plane side measurement patterns on the LDI. More specifically, as shown in FIG. 6B, a pinhole PH may be formed in the object plane side measurement pattern 310 and the image plane side measurement pattern 320.

The PDI needs the light quantity 100 times to 1000 times as high as the LDI, and has a problem of a long measurement time period. However, a measurement used to calculate an offset error (reference wavefront aberration) as in this embodiment has a lower frequency than the normal measurement, and is likely to be long. Therefore, the measurement that utilizes the PDI becomes effective.

When the illumination apparatus 210 has a bad spatial coherence, the grating 340 may be arranged before the object plane side measurement mask 310 so as to irradiate the diffracted light of an arbitrary order onto an aperture of the object plane side measurement pattern 310. The configuration shown in FIGS. 5A to 6B is merely illustrative, and the PDI's structure is not limited to the configuration shown in FIGS. 5A to 6B.

The diffraction wavefronts Wro1 and Wri1 can be calculated from a shape of the slit 312 of the object plane side measurement mask 310, a shape of the slit 324 of the image plane side measurement mask 320, physical properties of members in the object plane side measurement mask 310 and the image plane side measurement mask 320. For example, shapes of the slits 312 and 324, and the physical properties of the members of the object plane side measurement mask 310 and the image plane side measurement mask 320 are measured by a scanning electron microscope ("SEM"), an atomic force microscope ("AFM"), or a polarization analysis method, and the diffraction wavefronts Wro1 and Wri1 may be calculated by an electromagnetic analysis method. Of course, design values of the shapes of the slits 312 and 324, and the physical properties of the members of the object plane side measurement mask 310 and the image plane side measurement mask 320 may be used.

Next follow calculations of the diffraction wavefront Wro2 of the slit 312A of the object plane side measurement mask 310 and the diffraction wavefront Wri2 of the slit 324A of the image plane side measurement mask 320 used to measure the second primary wavefront of the projection optical system 230 (step 1004). The diffraction wavefronts Wro2 and Wri2 are obtained through measurements, as discussed above, by using a wavefront measurement apparatus, such as a PDI, which is installed inside and outside the exposure apparatus 200. Of course, the diffraction wavefronts Wro2 and Wri2 may be calculated based on measurement values or design values of the shapes of the slits 312A and 324A, and the physical properties of the members in the object plane side measurement mask 310 and the image plane side measurement mask 320. Assume that a second diffraction wavefront Wr2 is set to a sum (=Wro2+Wri2) between the diffraction wavefronts Wro2 and Wri2.

The slits 312 and 324 and the slits 312A and 324A are targets to be measured in the steps 1002 and 1004 of this embodiment. Alternatively, the sample slits 316 and 316A and the sample slits 326 and 326A, which have the same shape and are formed at different positions, may be targets to be measured. The measurements of the sample slits 316 and 316A and the sample slits 326 and 326A are effective when it is difficult to measure the slits 312 and 324 and the slits 312A and 324A. When manufacturing errors (or shape errors) among the slits 312 and 324, the slits 312A and 324A, the sample slits 316 and 316A, and the sample slits 326 and 326A are small, the measurements of the sample slits 316 and 316A and the sample slits 326 and 326A are also effective.

Next, a first primary wavefront of the projection optical system 230 is measured (step 1006). The illumination apparatus 210 illuminates the slits 312 and 314 of the object plane side measurement mask 310 arranged on the reticle stage 220. The images of the slits 312 and 314 are formed on the slits 322 and 324 of the image plane side measurement mask 320 arranged on the wafer stage 240 via the projection optical system 230. An interference pattern is formed through interference between two rays that have passed the slits 322 and 324, and taken by the area sensor 330 installed on the wafer stage 240. Thereby, the first primary wavefront of the projection optical system 230 can be obtained.

Next, a second primary wavefront of the projection optical system 230 is measured (step 1008). For example, the reticle stage 220 is moved and an illumination area of the illumination apparatus 210 is changed, the slits 312A and 314A orthogonal to the slits 312 and 314 are illuminated, and the second primary wavefront of the projection optical system 230 is obtained similar to the step 1006. In changing the illumination area of the illumination apparatus 210 and illuminating the slits 312A and 314A, the slits 312A and 314A are arranged in the isoplanatic area.

In order to avoid a spherical aberration by a transparent substrate having a measurement pattern, the object plane side measurement mask 310 is formed at the exit plane side of the transparent substrate, and the image plane side measurement mask 320 is formed at an incident plane side of the transparent substrate. When the illumination apparatus 210 has a bad spatial coherence, the grating 340 is arranged on the upper side of the object plane side measurement mask 310, but the diffracted light having an arbitrary order may be illuminated on the aperture (slit) of the object plane side measurement pattern 310.

Next, the first diffraction wavefront Wr1 (=Wro1+Wri1) obtained in the step 1002 is subtracted from the first primary wavefront W11 obtained in the step 1006 (step 1010). Thereby, the first primary wavefront W11$t$ (=W11−Wr1) is obtained, from which an error of the first diffraction wavefront Wr1 is removed.

Similarly, the second diffraction wavefront Wr2 (=Wro2+Wri2) obtained in the step 1004 is subtracted from the second primary wavefront W12 obtained in the step 1008 (step 1012). Thereby, the second primary wavefront W12$t$ (=W12−Wr2) is obtained, from which an error of the second diffraction wavefront Wr2 is removed.

A wavefront (aberration) of the projection optical system 230 is calculated based on the first primary wavefront W11$t$ obtained in the step 1010 and the second primary wavefront W12$t$ obtained in the step 1012 (step 1014). Errors of the diffraction wavefront (reference wavefront) generated from the slits 312 and 312A, and the slits 314 and 314A have been removed from the wavefront aberration of the projection optical system 230 calculated in the step 1014. Thus, the measurement apparatus and method of this embodiment reduces the influence of the measurement error caused by the slits 312 and 312A and the slits 314 and 314A, and can precisely measure the wavefront aberration of the projection optical system 230. The flow of the measurement method shown in FIG. 4 is merely illustrative, and the present invention is not limited to the flow shown in FIG. 4.

Figure 7:
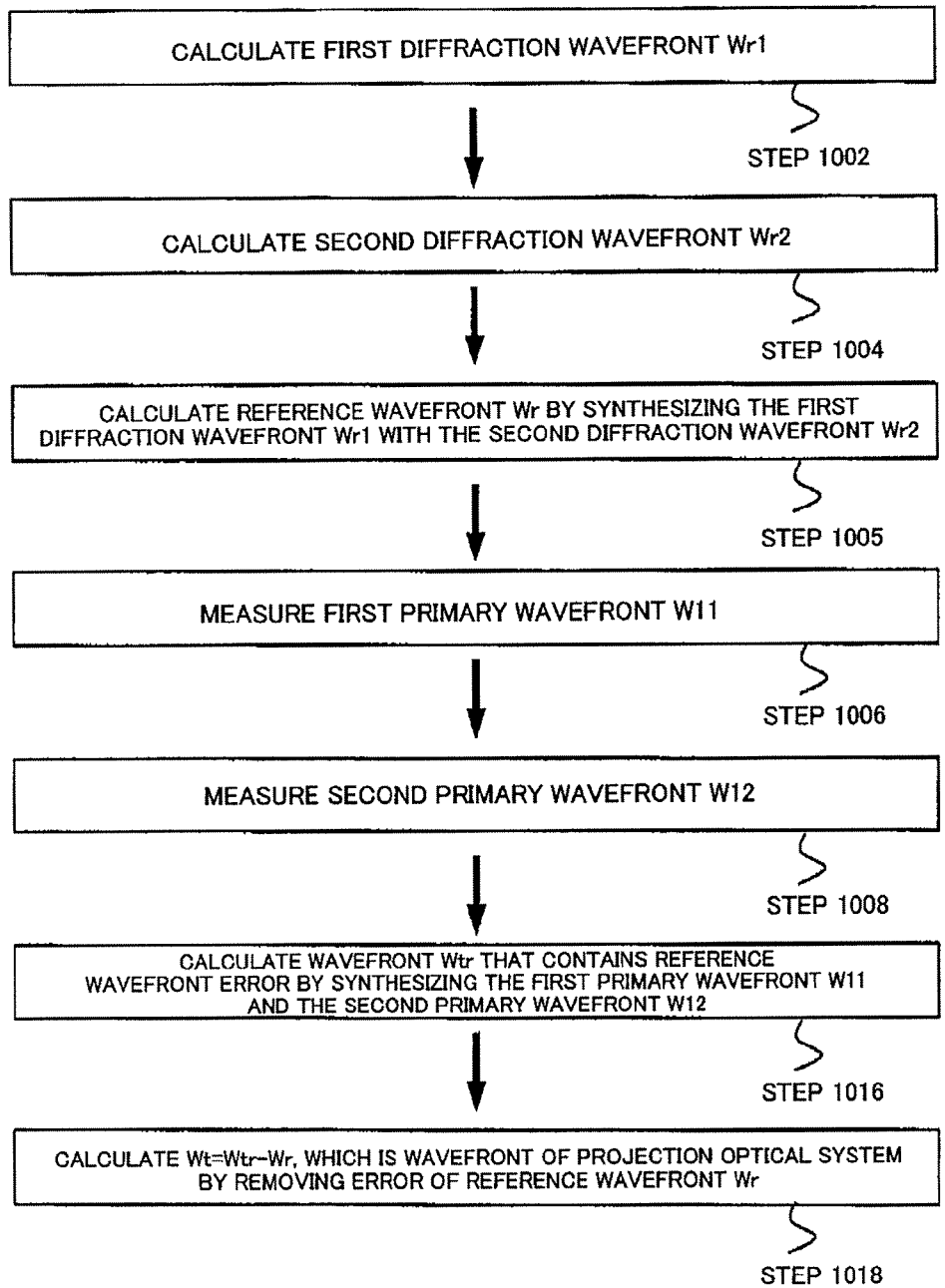
FIG. 7 is a flowchart for explaining a measurement method according to one aspect of the present invention.

Referring now to FIG. 7, a description will be given of another measurement method of the wavefront aberration of the projection optical system 230 that uses the measurement apparatus 300. FIG. 7 is a flowchart for explaining the measurement method according to one aspect of the present invention.

Initially, a diffraction wavefront Wro1 of the slit 312 and a diffraction wavefront (first diffraction wavefront) Wri1 of the slit 324 used to measure the first primary wavefront of the projection optical system 230 are found (step 1002). Similarly, a diffraction wavefront Wro2 of the slit 312A and a diffraction wavefront Wri2 (second diffraction wavefront) of the slit 324A are found (step 1004).

Next, the first diffraction wavefront Wr1 (=Wro1+Wri1) obtained in the step 1002 and the second diffraction wavefront Wr2 (=Wro2+Wri2) obtained in the step 1004 are synthesized to generate a synthesized wavefront (step 1005). This configuration provides a reference wavefront Wr in the measurement apparatus 300.

Next, the first primary wavefront W11 of the projection optical system 230 is measured (step 1006). The reticle stage 220 is moved or the illumination area of the illumination apparatus 210 is changed, and the second primary wavefront W12 of the projection optical system 230 is measured (step 1008).

Next, the first primary wavefront W11 obtained in the step 1006 is synthesized with the second primary wavefront W12 obtained in the step 1008 (step 1012). This configuration provides the wavefront Wtr of the projection optical system 230, which contains an error of the diffraction wavefront (reference wavefront) generated from the slits 312 and 324 and the slits 312A and 324A. In other words, the wavefront Wtr of the projection optical system 230 is a wavefront obtained by the conventional measurement apparatus.

The reference wavefront Wr obtained in the step [1005] is subtracted from the wavefront Wtr of the projection optical system 230 obtained in the step 1016 (step 1018). This configuration can provide a wavefront Wt (=Wtr−Wr) of the projection optical system 230, which does not contain errors of the diffraction wavefront (or reference wavefront Wr) generated from the slits 312 and 312A and the slits 324 and 324A. Thus, the measurement apparatus and method of this embodiment reduce the influence of manufacturing errors caused by the slits 312 and 312A and the slits 324 and 324A, and can precisely measure the wavefront aberration of the projection optical system 230. The flow of the measurement method shown in FIG. 7 is merely illustrative, and the present invention is not limited to the flow of the measurement method shown in FIG. 7.

The projection optical system 230 has a correction optical system (not shown), and can correct an aberration of the projection optical system 230 through feedback control of the measured wavefront aberration to the projection optical system 230. For example, the correction optical system includes plural optical elements that are configured movable in the optical axis direction and/or a direction orthogonal to the optical axis, and one or more optical elements are driven based on aberration information obtained from the measurement apparatus and method of this embodiment. This configuration can correct or optimize a wavefront aberration of the projection optical system 230. The correction or adjustment means of the aberration of the projection optical system 230 can apply various known technologies, such as an inclinable plane-parallel plate, a pressure-controllable space, and plane corrections by an actuator.

In exposure, the light emitted from the illumination apparatus 210 illuminates the reticle RT. The light that has passed the reticle RT and reflected the reticle pattern is imaged on the wafer WF through the projection optical system 230. A wavefront aberration of the projection optical system 230 in the exposure apparatus 200 is well-corrected, as discussed above, and the projection optical system 230 has an excellent imaging characteristic or high resolving power. Therefore, the exposure apparatus 200 can provide a high quality device at a high throughput and economical efficiency. Due to a simple structure of the measurement apparatus 300 that measures the wavefront aberration of the projection optical system 230, the exposure apparatus 200 can maintains a small size and a low cost of the apparatus.

Figure 12:
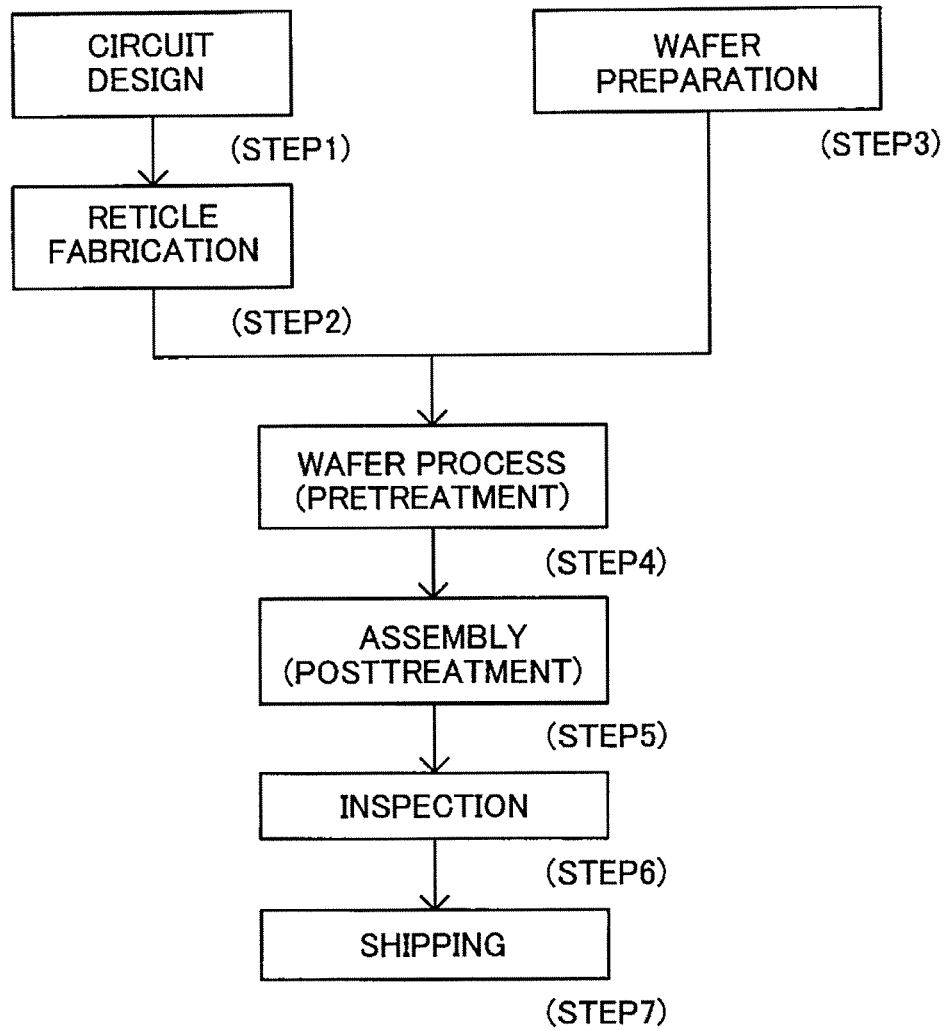
FIG. 12 is a flowchart for explaining a manufacture of a device.
Figure 13:
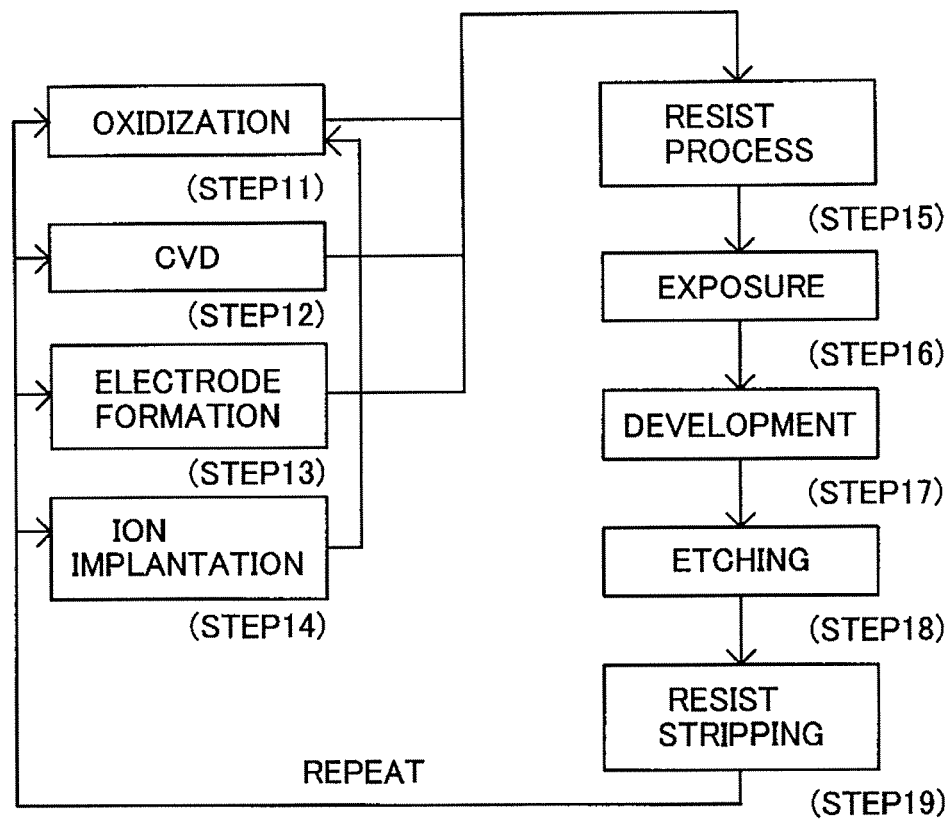
FIG. 13 is a flowchart of details of a wafer process of the step 4 shown in FIG. 12.

Referring now to FIGS. 12 and 13, a description will be given of an embodiment of a device manufacturing method using the above exposure apparatus 200. FIG. 12 is a flowchart for explaining a fabrication of a device, such as a semiconductor device and a liquid crystal display device. Here, a description will be given of a fabrication of a semiconductor device in an example. Step 1 (circuit design) designs a semiconductor device circuit. Step 2 (reticle fabrication) forms a reticle having a designed circuit pattern. Step 3 (wafer preparation) manufactures a wafer using materials such as silicon. Step 4 (wafer process), which is referred to as a pretreatment, forms actual circuitry on the wafer through photolithography using the reticle and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 13 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the above exposure apparatus 200 to expose a reticle pattern onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. This device manufacturing method can manufacture higher quality devices than ever. Thus, the device manufacturing method that uses the exposure apparatus 200, and its resultant products also constitute one aspect of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-163188, filed on Jun. 13, 2006, which is hereby incorporated by reference herein in its entirety.

What is claimed is:

1. A measurement method for measuring a wavefront aberration of a target optical system using an object plane mask that is arranged on an object plane side of the target optical system and includes a first object plane mask slit and a second object plane mask slit, and an image plane mask that is arranged on an image plane side of the target optical system and includes a first image plane mask slit and a second image plane mask slit, the first object plane mask slit having a width in a shorter direction, which is equal to or smaller than a diffraction limit of the target optical system, the second object plane mask slit having a width in a shorter direction, which is close to or greater than the width of the first object plane mask slit, the first image plane mask slit having a width in a shorter direction, which is equal to or smaller than the diffraction limit of the target optical system, the second image plane mask slit having a width in a shorter direction, which is greater than the diffraction limit of the target optical system, said measurement method comprising the steps of:

measuring a first reference wavefront generated from the first object plane mask slit by interference between light from a slit having the same shape as that of the first object plane mask slit and light from a pinhole;

measuring a second reference wavefront generated from the first image plane mask slit by interference between light from a slit having the same shape as that of the first image plane mask slit and light from a pinhole;

measuring a wavefront of the target optical system including a reference wavefront error from an interference pattern formed by interference between light from the first image plane mask slit and light from the second image plane mask slit; and subtracting the measured first and second reference wavefronts from the target optical system including the measured reference wavefront error.

2. The measurement method according to claim 1, wherein the target optical system is a projection optical system in an exposure apparatus, the exposure apparatus includes the object plane mask and the image plane mask, wherein the first reference wavefront and the second reference wavefront are measured by a point-diffraction interferometer configured differently from the exposure apparatus, and wherein the point-diffraction interferometer includes a pinhole and a slit that includes a slit having the same shape as the first object plane mask slit and a slit having the same shape as the first image plane mask slit.

3. A measurement apparatus for measuring a wavefront aberration of a target optical system, said measurement apparatus comprising:

an object plane mask that is arranged on an object plane side of the target optical system and includes a first object plane mask slit and a second object plane mask slit, the first object plane mask slit having a width in a shorter direction, which is equal to or smaller than a diffraction limit of the target optical system, the second object plane mask slit having a width in a shorter direction, which is closer to or greater than the width of the first object plane mask slit;

an image plane mask that is arranged on an image plane side of the target optical system arranged and includes a first image plane mask slit and a second image plane mask slit, the first image plane mask slit having a width in a shorter direction, which is equal to or smaller than the diffraction limit of the target optical system, the second image plane mask slit having a width in a shorter direction, which is greater than the diffraction limit of the target optical system, a detector configured to detect an interference pattern formed by transmitting light or reflected light from the first and the second image plane mask slits; and an obtainer configured to obtain a first reference wavefront generated from the first object plane mask slit and a second reference wavefront generated from the first image plane mask slit, wherein the wavefront aberration of the target optical system is measured based on the interference pattern detected by the detector, and the first reference wavefront and the second reference wavefront obtained by the obtainer, wherein the object plane mask further includes an object plane mask pinhole, wherein the image plane mask further includes an image plane mask pinhole, and wherein the obtainer obtains the first reference wavefront from the interference pattern formed by interference between light from the first object plane mask slit and light from the object plane mask pinhole, and obtains the second reference wavefront from the interference pattern formed by interference between light from the first image plane mask slit and light from the image plane mask pinhole.

4. An exposure apparatus configured to expose a pattern of a reticle onto a substrate using light from a light source, said exposure apparatus comprising:

a projection optical system configured to project the pattern onto the substrate; and a measurement apparatus configured to measure a wavefront aberration of the projection optical system using the light, wherein the measurement apparatus includes:

an object plane mask that is arranged on an object plane side of the projection optical system and includes a first object plane mask slit and a second object plane mask slit, the first object plane mask slit having a width in a shorter direction, which is equal to or smaller than a diffraction limit of the projection optical system, the second object plane mask slit having a width in a shorter direction, which is closer to or greater than the width of the first object plane mask slit;

an image plane mask slit that is arranged on an image plane side of the projection optical system arranged and includes a first image plane mask slit and a second image plane mask slit, the first image plane mask slit having a width in a shorter direction, which is equal to or smaller than the diffraction limit of the projection optical system, and the second image plane mask slit having a width in a shorter direction, which is greater than the diffraction limit of the projection optical system, a detector configured to detect an interference pattern formed by transmitting light or reflected light from the first and the second image plane mask slits; and an obtainer configured to obtain a first reference wavefront generated from the first object plane mask slit and a second reference wavefront generated from the first image plane mask slit, wherein the wavefront aberration of the projection optical system is measured based on the interference pattern detected by the detector, and the first reference wavefront and the second reference wavefront obtained by the obtainer, wherein the object plane mask further includes an object plane mask pinhole, wherein the image plane mask further includes an image plane mask pinhole, and wherein the obtainer obtains the first reference wavefront from the interference pattern formed by interference between light from the first object plane mask slit and light from the object plane mask pinhole, and obtains the second reference wavefront from the interference pattern formed by interference between light from the first image plane mask slit and light from the image plane mask pinhole.

* * * * *